United States Patent [19]
Debus et al.

[11] Patent Number: 4,643,319
[45] Date of Patent: Feb. 17, 1987

[54] FRAMEWORK FOR A SWITCHBOARD CABINET

[75] Inventors: Jurgen Debus; Hans-Georg Koch, both of Dietzholztal; Jurgen Zachrai, Dillenburg; Helmut Butergerds, Eschenburg, all of Fed. Rep. of Germany

[73] Assignee: Rittal-Werk Rudolf Loh GmbH & Co. KG, Fed. Rep. of Germany

[21] Appl. No.: 679,805

[22] Filed: Dec. 10, 1984

[30] Foreign Application Priority Data

Dec. 9, 1983 [DE] Fed. Rep. of Germany ....... 3344598

[51] Int. Cl.⁴ ................................................ A47F 5/00
[52] U.S. Cl. .................................... 211/189; 211/191; 211/182; 312/140
[58] Field of Search ................. 211/41, 189, 191, 182, 211/26, 187; 312/140

[56] References Cited

U.S. PATENT DOCUMENTS

| | | | |
|---|---|---|---|
| 3,194,407 | 7/1965 | D'Altrui | 211/191 |
| 3,221,894 | 12/1965 | Knuth | 211/182 X |
| 3,468,430 | 9/1969 | Lawman | 211/182 |
| 3,919,603 | 11/1975 | Solvati et al. | 211/182 X |
| 4,045,104 | 8/1977 | Peterson | 211/182 X |
| 4,250,815 | 2/1981 | Swanson | 211/182 X |
| 4,261,470 | 4/1981 | Dolan | 211/182 X |

FOREIGN PATENT DOCUMENTS 1753038 7/1971 Fed. Rep. of Germany.

*Primary Examiner*—Robert W. Gibson, Jr.
*Attorney, Agent, or Firm*—Thomas W. Speckman

[57] ABSTRACT

This invention relates to a framework for a switchboard cabinet, comprising at least twelve interlocking frame sections of an identical hollow rectangular structure, in which the hollow rectangular structure has rows of holes and forms an outer corner at the junction of two perpendicular side sections. Opposite the outer corner, the hollow rectangular structure has two side sections, each extending parallel to an opposite side forming the outer corner. The outer corners of all frame sections are aligned correspondingly and face the interior of the framework. Due to the special construction and arrangement of the frame sections, a framework is produced which is expandable with positive sealing on all sides, and in which interconnecting transverse struts, support rails, structural elements and the like, may be installed on all frame sections.

26 Claims, 14 Drawing Figures

FRAMEWORK FOR A SWITCHBOARD CABINET

BACKGROUND OF THE INVENTION

1. Field of the Invention

The present invention relates to a framework for a switchboard cabinet, comprising at least twelve interlocking frame sections of identical hollow structure, in which the hollow structure of the frame section is provided with rows of holes and forms an outer corner at the junction of two perpendicular side sections. The hollow structure has two side sections forming an outer corner, each of the side sections extends beyond the hollow structure away from the outer corner. The outer corners of all frame sections are aligned correspondingly and face the interior of the framework.

2. Description of the Prior Art

A frame of this general type is known to the art and is described, for example, in German Patent Publication No. OS 17 53 038. In this known frame, all of the outer corners face outwardly with respect to the interior space so that the two sides are in alignment with the planes of the joining sides of the switchboard cabinet. The side sections are set back relative the corner sides, and one side section is provided with a row of holes. One corner side is offset to permit wall tiles to be affixed flush with the square shape.

While leg sections having a hollow shape of this type make it possible to utilize one leg section as an abutment for a door and another leg section as a fastening member for support rails, there is only one direction in which support rails may be installed, and that is parallel to one of the abutting sides of the switchboard cabinet. Moreover, this prior art frame does not provide simple, sealed, adjacent joining of such frames. The advantage of this prior art structure resides solely in the use of a uniform hollow structure for all twelve of its frame legs.

SUMMARY OF THE INVENTION

It is one object of the present invention to provide a framework of the aforementioned type which, while utilizing identical hollow shaped frame sections, permits the installation of support rails and the like on all frame sections in either direction of any two of the abutting sides of the switchboard cabinet, and which permits expansion by mounting additional frame sections on all sides while providing positive sealing at the joints.

According to the present invention, the hollow frame sections are in the form of tubular, generally hollow, rectangular structures, the outer corners of all interconnected frame sections being directed toward the interior of the framework, the terminal side sections are extensions away from the outer corner of the respective side sections originating at the outer corner. The side sections are provided with identical rows of holes aligned with the outer corner. The frame sections forming the front and the back of the framework form with their projecting terminal side sections frame-like sealing struts extending perpendicularly to the plane of the front and back framework, and the frame sections forming the sides of the framework form with their projecting terminal side sections an abutment frame extending perpendicularly to the plane of the vertical side framework.

By arranging the outer corners of the frame sections on the interior side of the framework and providing symmetrical rows of holes in the abutting sides, mounting capabilities are provided on each frame section in two directions to facilitate installation of support rails, switching equipment and the like. The terminal sections of the side sections are thus aligned and act as sealing struts and abutment frames, to permit adjacent mounting of frame sections of this type, well sealed by associated sealing elements, and also to achieve positive sealing of installed side panels and doors. Where sealing struts abut, H-shaped sealing sections may be employed.

One embodiment which is particularly advantageous is characterized in that the hollow, rectangular structure of the frame section encloses a receiving space having a rectangular cross section, and that the holes comprising rows of holes in the side sections are rectangular and are spaced equidistant from each other. To provide additional installation capabilities, another embodiment provides for bores between the rectangular holes comprising rows of holes, the bores offset by one half interval from the rectangular holes.

Another useful embodiment is characterized in that holes comprising rows of holes on all vertical frame sections are aligned in the same planes, that the holes in all horizontal frame sections extending parallel to the front and back planes of the frame structure are aligned in the same vertical planes parallel to the front and back of the frame structure, and that the holes in all horizontal frame sections extending vertically to the front and back sections of the frame are arranged in the same vertical planes extending perpendicularly to the front and back of the frame structure. Support rails, transverse struts and the like may then be easily installed horizontally and vertically in the front.

In another embodiment, one flat side section of the hollow, rectangular structure of the frame section terminates on the side away from the hollow, rectangular structure by a bent over portion forming an enlarged overlying end section. The overlying end is provided on the side facing the hollow, rectangular structure with a toothed section of rectangular teeth spaced at regular intervals, the teeth being in alignment with the rectangular holes in the side sections of the hollow, rectangular structure permitting suitable fittings, hardware or the like to be affixed at these predetermined intervals on such side sections. The fittings are preferably provided with counter serrations at their fastening surface which may be engaged with the toothed section on the flat side section of the hollow, rectangular frame section structure.

Assembly of the individual frame sections to form the framework of the cabinet proper is accomplished according to another embodiment, when the individual sections are welded to each other at the corners. The corner joint may be reinforced by corner connecting elements which may be inserted, by means of projections thereon, into the receiving spaces of the abutting frame sections and the frame sections may be screwed or welded at the corners to the corner connectors.

The framework may be reinforced to resist torsional forces by providing additional transverse struts having at least two perpendicular sides which are provided with identical rows of holes, aligned with those in the frame sections, serving to connect oppositely located horizontal or vertical sections of the frame.

Preferably, the transverse struts utilize a structure which has a rectangular interior space that corresponds to the interior space of the hollow, rectangular structure of the frame sections. One side of the strut is provided with a continuous slot through which the interior is accessible. The transverse struts are also adapted to accommodate sliding nuts which afford further attachment capabilities in two directions.

The connection between a transverse strut and a frame section of the framework is, according to another embodiment, such that the interior receiving space of the transverse strut is adapted to receive a block-type nut which is secured by a head screw to a frame section.

If the interior bore of the nut has screw threads therein and the front faces are provided with rectangular protuberances corresponding to holes in the frame sections, and one side of the transverse strut is provided with fastening holes, the nut may be firmly screwed onto the transverse strut. The introduction of the head screw into a rectangular hole in a leg of the framework is facilitated by the rectangular cross section of the screw head, whereby the shorter dimension corresponds to the dimension of the holes in the frame sections, while the longer dimension is slightly greater and permits the oblique insertion of the screw head into the hole. After proper alignment, the screw is retained by the screw head in the frame section. Tightening of the nut on the frame section is facilitated in that the head screw is provided at the terminal end of its threaded portion with a tool holder by which the inserted head screw may be turned or securely held by a tool.

According to another embodiment, each rectangular hole in each frame section may be utilized for attachment of any part when nuts having a rectangular raised portion on the side facing the screw thread are non-rotatably insertable from within the hollow space into the rectangular holes in the sides of frame sections and transverse struts, these nuts provided with a handle projecting through the corresponding hole on the abutting side section, if the handle is separable from the nut at a weakened breaking point, then, after establishing the connection, the handle can be broken off, leaving no part of the nut projecting from the hollow, rectangular structure of the frame section. With the handle severed, the same nut may also be used as a sliding nut with a component having a T-shaped groove or receiving space.

To attach hardware, fittings and the like and to assemble framework structures in an adjacent, successive fashion, one preferred embodiment is one in which the sides opposite the side sections abutting at the outer corner of the hollow rectangular structure are provided with additional bores aligned with corresponding rectangular holes in side sections abutting at the outer corner.

Capability of several framework structures to be laterally joined together is provided, according to another embodiment, wherein one side section of each frame section is provided at its free end with a terminal section angularly bent towards the interior of the frame section, the frame sections forming the sides of the framework in combination with the terminal sections of the angular side section, convert the sealing struts to abutment frames, the abutment surfaces of which extend parallel to the plane of the sides of the framework, and the terminal sections of the angular side sections are provided with slot-shaped apertures which are aligned with the bores in the opposite and parallel sides of the hollow, rectangular structure.

Individual frame sections of the framework structure may be produced by cutting off appropriate lengths from a drawn form or a rolled form, as is known to the art.

When using a rolled form, one advantageous embodiment has the outer flat side sections and the inner side sections of the hollow, rectangular structure formed of two pieces and an enlargement on the end of one flat side section is produced when an end section of the outer layer is turned upon the inner layer, the bent end section having punched out teeth and notches thereon. This toothed section may be punched out prior to the rolling operation.

When provision is made for all corners and edges of the frame section to be rounded, there are no sharp edges which may present danger spots for injuries.

According to another embodiment, the walls and doors which may be mounted to the framework are provided with an inverted flange which extends about the frame-like sealing strut on front and back walls and the abutment frame on the side walls of the frame structure, and the walls and doors are provided with sealing elements where they engage the sealing strut and the abutment frame, then the framework structure proper and any adjacent frames successively added are sealed on all sides.

BRIEF DESCRIPTION OF THE DRAWINGS

The invention will be further described with reference to one embodiment illustrated in the drawings in which.

DESCRIPTION OF THE PREFERRED EMBODIMENTS

Figure 1:
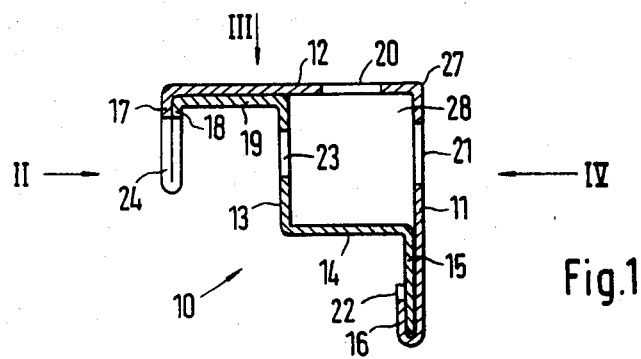
FIG. 1 is a cross-sectional view of a hollow, rectangular structure of the frame section.
Figure 2:
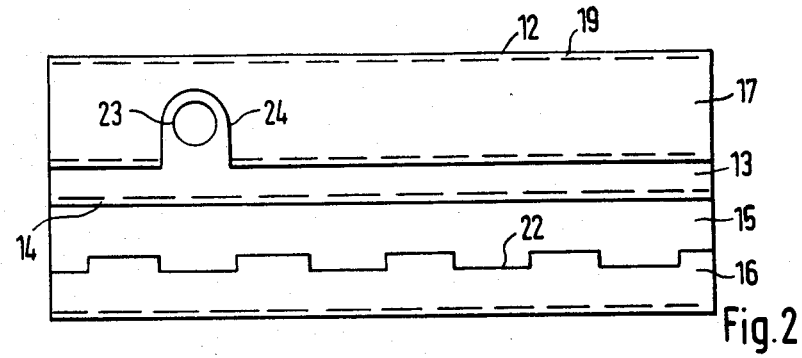
FIG. 2 illustrates the structure of FIG. 1, as viewed from the direction of arrow II.
Figure 3:
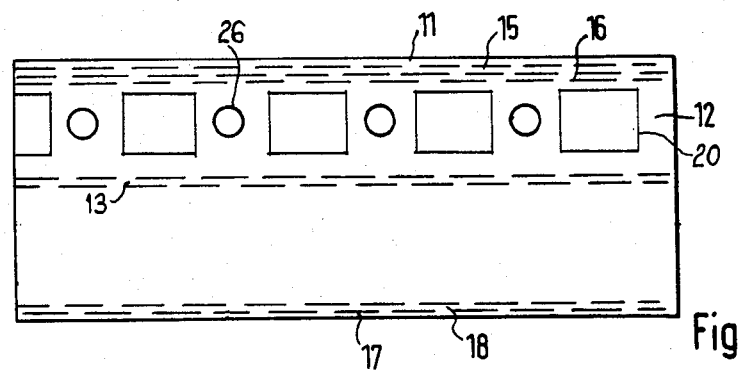
FIG. 3 illustrates the structure of FIG. 1, as viewed from the direction of arrow III.
Figure 4:
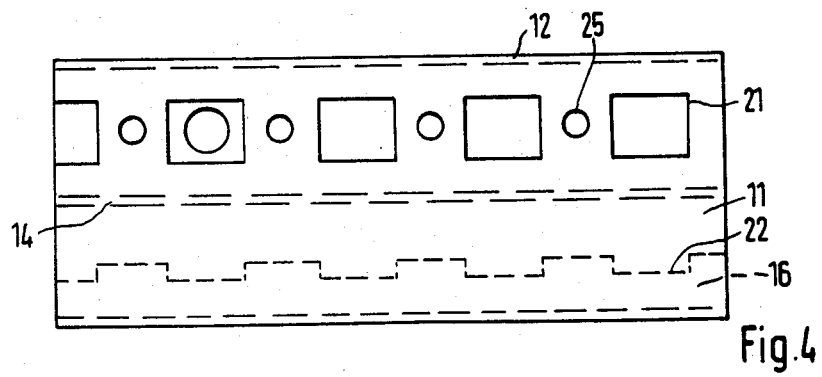
FIG. 4 illustrates the structure of FIG. 1, as viewed in the direction of arrow IV.

FIG. 1 shows a cross-sectional view of a frame section of tubular, generally hollow, rectangular structure 10 enclosing a rectangular space or void, and side sections 11, 12 having terminal extensions integrally formed thereon. One of the terminal side sections is simply an extension of side section 11, while the other is an extension of side section 12, but is perpendicularly bent at its terminal end to form end section 17 which extends parallel to side section 13 of hollow, rectangular structure 10. In the illustrated embodiment, the hollow structure is formed by hot rolling, and the side sections 11, 12 and end section 17 have two layers, including sections 15, 18 and 19. Side section 11 is bent at its terminal end to form end section 16 overlying section 15, producing an enlargement at the terminal end of the flat side section 11. The terminal edge of end section 16 is provided with punched out teeth or notches 22 which are aligned with rectangular holes 20, 21 in side sections 11, 12, as shown in FIGS. 2–4. Rectangular holes 20, 21 are disposed at regular intervals and equidistant from outer corner 27 where side sections 11, 12 meet. Side sections 11, 12 are also provided with bores 25, 26 offset by one half interval from the rectangular holes, to afford additional attachment capabilities on the hollow, rectangular structure. End section 17 of side section 12 and underlying section 18 are provided with notches 24 which are aligned with bores 23 in side section 13 and rectangular holes 21 in side section 11 of hollow, rectangular structure 10. Likewise, side section 14 of hollow, rectangular structure 10 may be provided with bores 51 (FIGS. 13 and 14) which are aligned with rectangular holes 20 in side section 12 in order that structural elements and the like may be affixed to side section 14 of hollow, rectangular structure 10.

Figure 5:
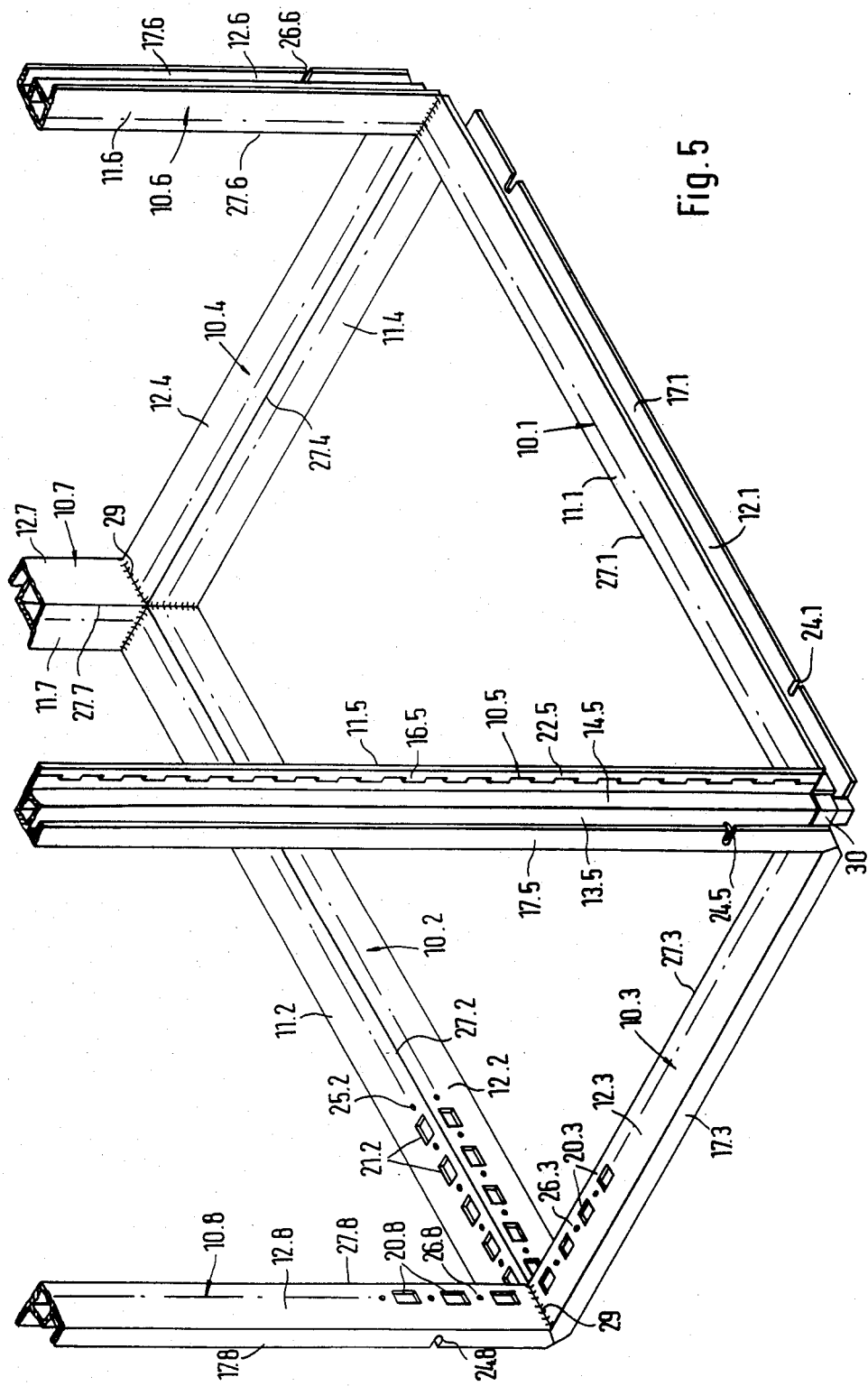
FIG. 5 is a perspective view of the base of a framework according to this invention.
Figure 6:
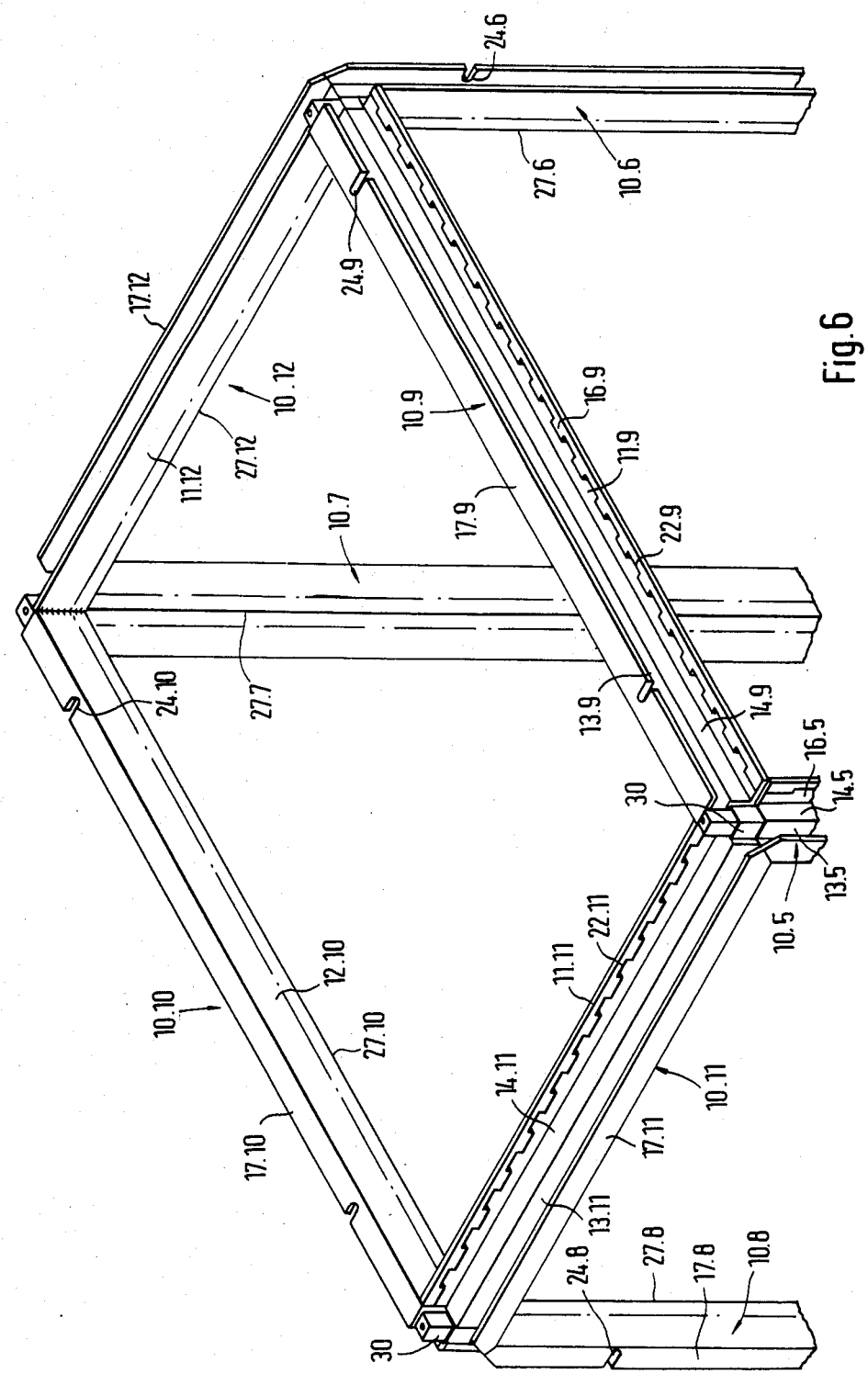
FIG. 6 is a perspective view of the top of a framework, according to this invention.

According to this invention, not only is the cross-sectional configuration of the hollow rectangular structure of major importance, but also of importance is the particular fashion in which twelve individual sections 10.1 to 10.12 comprising hollow rectangular structures are assembled to form the framework. The assembled framework is illustrated in FIGS. 5 and 6. An important feature is that all of the outer corners 27.1 to 27.12 of hollow, rectangular structures 10.1 to 10.12 are on the interior side of the framework so that outer corners 27.1 to 27.12 are aligned to form a continuous "edge structure". Frame sections 10.1, 10.5, 10.6 and 10.9 form a front portion of the framework. Side sections 11.1, 11.5, 11.6 and 11.9 with their flat extensions extend toward the exterior and face each other to form a frame-like sealing strut perpendicular to the plane of the front. Side sections 12.1, 12.5, 12.6 and 12.9 extend outwardly and their end sections 17.1, 17.5, 17.6 and 17.9 are parallel with the other side sections of the frame structure adjacent the outer corners.

Likewise, frame sections 10.2, 10.7, 10.8 and 10.10 form the rear portion of the framework. Again, side sections 11.2, 11.7, 11.8 and 11.10 form a frame-like sealing strut perpendicular to the plane of the back, while the end sections 17.2, 17.7, 17.8 and 17.10 are parallel to the other side sections adjacent the outer corners.

The front and rear portions of the framework are connected by frame sections 10.3, 10.4 at the bottom, and by frame sections 10.11, 10.12 at the top. Frame section 10.3 is oriented with its outer corner 27.3 abutting outer corners 27.1, 27.5 of the frame sections 10.1, 10.5 and abutting outer corners 27.2, 27.8 of frame sections 10.2, 10.8. Outer corner 27.4 of frame section 10.4 is likewise in abutting relationship with outer corners 27.1, 27.6, 27.2 and 27.7 of frame sections 10.1, 10.6, 10.2 and 10.7 to complete the structural form on the underside of the framework. In this arrangement, side sections 12.3, 12.4 of frame sections 10.3, 10.4 face upwardly to enable end sections 17.3, 17.4 to complete the continuous abutment frame formed at the vertical sides of the framework. End sections 17.3, 17.5, 17.8 and 17.11 of frame sections 10.3, 10.5, 10.8 and 10.11 comprise an abutment frame on one side of the framework, since frame sections 10.11, 10.12 forming the top portion of the framework are aligned so that their side sections 12.11, 12.12 are adjacent side sections 12.5 and 12.8, 12.6 and 12.7, respectively, and their side sections 11.11 and 11.12 extend vertically.

On the other side of the framework, end sections 17.4, 17.6, 17.7 and 17.12 of frame sections 10.4, 10.6, 10.7 and 10.12 form a continuous abutment frame which extends parallel to the plane of that side of the framework.

This arrangement of frame sections provides, adjacent each outer corner of the frame sections and aligned therewith, one attachment location in each direction of the frame side sections meeting at the outer corner, as indicated by rectangular holes 20 and 21 in side sections 11, 12 meeting at outer corner 27.

Toothed segments having notches 22 at regular intervals are provided on end sections 16 of the flat leg extensions and are disposed on the terminal ends of the frame-like sealing struts, on both the front and back walls of the framework. This feature facilitates the installation of doors, as will be described shortly.

Any three abutting frame sections may be welded together at the corners of the framework, as indicated by weld seams 29. Corner connecting elements 30 which are known to the art, may also be used; they have protuberances which are inserted into receiving space 28 of hollow, rectangular structure 10. Such corner connectors may be screwed and/or welded to the frame sections.

Figure 7:
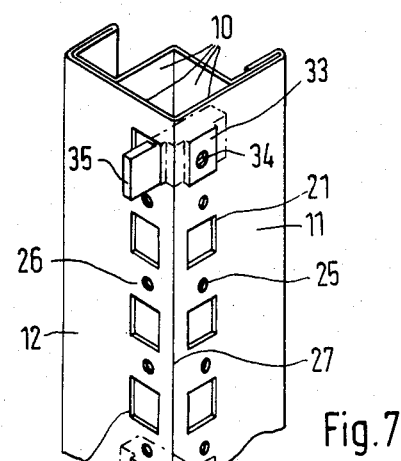
FIG. 7 shows the insertion of specialized nuts into the rectangular holes of a frame leg.
Figures 8, 9:
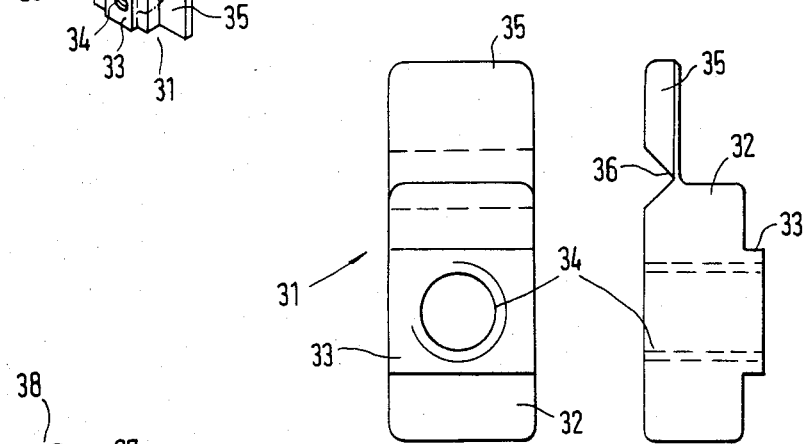
FIG. 8 is a top view of the specialized nut of FIG. 7.
FIG. 9 is a side view of the nut of FIG. 7.

FIG. 7 illustrates how rectangular hole 20 or 21 in side sections 12 or 11 of a frame section, the longer dimension of the rectangular hole being directed lengthwise with respect to the frame section, is employed to attach a structural element. For this attachment, nut 31 is used, as shown in FIGS. 8 and 9. Block 32 of nut 31 has internal screw thread 34 terminating at one side in projecting connecting member 33. Formed on one end of block 32 is handle 35 which is adapted to be broken off at the weakened breaking point 36. With the aid of handle 35, nut 31 may be introduced through rectangular hole 21 in side section 11 and projecting connecting member 33 may be retained in rectangular hole 20 in side section 12 in a non-rotatable fashion, so that a fastening bolt or screw may be threadedly inserted into screw thread 34 which is accessible through rectangular hole 20. When connection of the structural element is established, handle 35 may be broken off so that no part of nut 31 projects from hollow, rectangular structure 10. Likewise, nut 31 may be inserted through rectangular hole 20 in side section 12 to be non-rotatably retained in rectangular hole 21 of side section 11. Handle 35 must be at a proper distance from projecting connecting member 33 corresponding to the distance between rectangular holes 20 and 21 and outer corner 27.

When handle 35 is broken off, nut 31 may also function as a sliding nut if inserted into a correspondingly T-shaped groove in a contoured rail. Connecting projection 33 would be non-rotatably guided in the groove of the contoured rail, which would afford access to the undercut receiving space of the T-shaped groove. Thus, nut 31 may be employed as a sliding nut on a structural section according to FIG. 12. Lengths of this structural section may be cut to form transverse struts 44 for connecting two vertical or two horizontal frame sections. Transverse struts 44 may also have an L-shaped or U-shaped cross section, or may be in the form of a closed rectangular structure. It is essential they have, like frame sections 10.1 to 10.12, two side sections extending perpendicular to each other which are provided with rows of rectangular holes 45, 49 at regular intervals and aligned with respect to the corner, as well as intermediate bores 46 and 50. The interior receiving space of transverse strut 44 corresponds in cross section to receiving space 28 of hollow, rectangular structure 10. The other side sections of transverse strut 44 are provided with bores 47 and slot 48. It is understood that any of the rectangular structures may be square.

Figure 11:
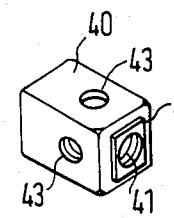
FIG. 11 is a perspective view of the block-shaped nut.
Figure 12:
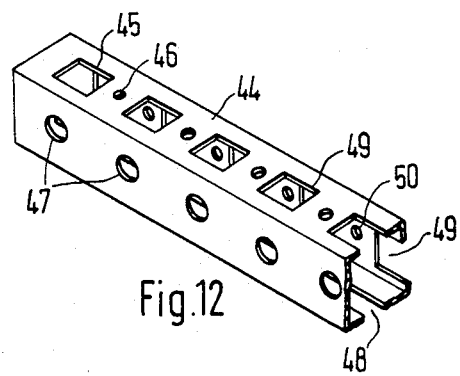
FIG. 12 shows a portion of a transverse strut adapted to be fastened to a frame section by means of the head screw of FIG. 10 and the nut of FIG. 11.

Block-type nut 40 having continuous screw thread 41, as shown in FIG. 11, is insertable into the interior receiving space of transverse strut 44 of FIG. 12, nut 40 being attached by means of screws to transverse strut 44. For this purpose, the lateral portions of the nut are provided with screw threads 43.

Figure 10:
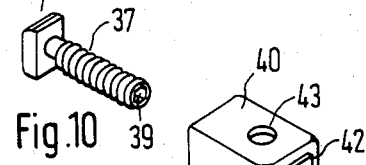
FIG. 10 is a perspective view of the head screw.

A fastening bolt may be introduced through a bore 47 of transverse strut 44 and screwed into screw thread 43 of nut 40. Prior thereto, however, nut 40 is secured to a frame section using a head screw according to FIG. 10. This is accomplished by obliquely inserting rectangular head 38 of screw 37 into a rectangular hole 20 or 21 in a frame section, for which purpose one dimension of head 38 corresponds to one dimension of hole 20 or 21. The other dimension is slightly larger so that head 38, with screw 37 shank held obliquely, can be inserted into hole 20 or 21 where, upon alignment of the screw, the head will be positioned behind hole 20 or 21. The head screw is thus secured against retraction from hole 20 or 21. Nut 40 is already screwed onto head screw 37 for a distance such that it merely needs to be tightened. The end of head screw threads 37 is provided with tool holder 39, so that it may be non-rotatably retained as long as the nut 40 is freely rotatable. After square protuberance 42 of nut 40 has been inserted into hole 20 or 21, however, nut 40 can no longer be turned. At this point, head screw 37 is turned until the connection is firm. Nut 40 may also be directly non-rotatably retained in hole 20 or 21. In this case, the connection between nut 40 and the frame section is established merely by turning head screw 37 inserted into hole 20 or 21.

Transverse struts 44 thus secured and aligned with their edges relative to the edges of the frame may then be secured to the frame sections. Here again, the holes in the two side sections afford attachment capabilities in two directions, for example, in the plane of the associated side of the frame and perpendicularly thereto.

Figure 13:
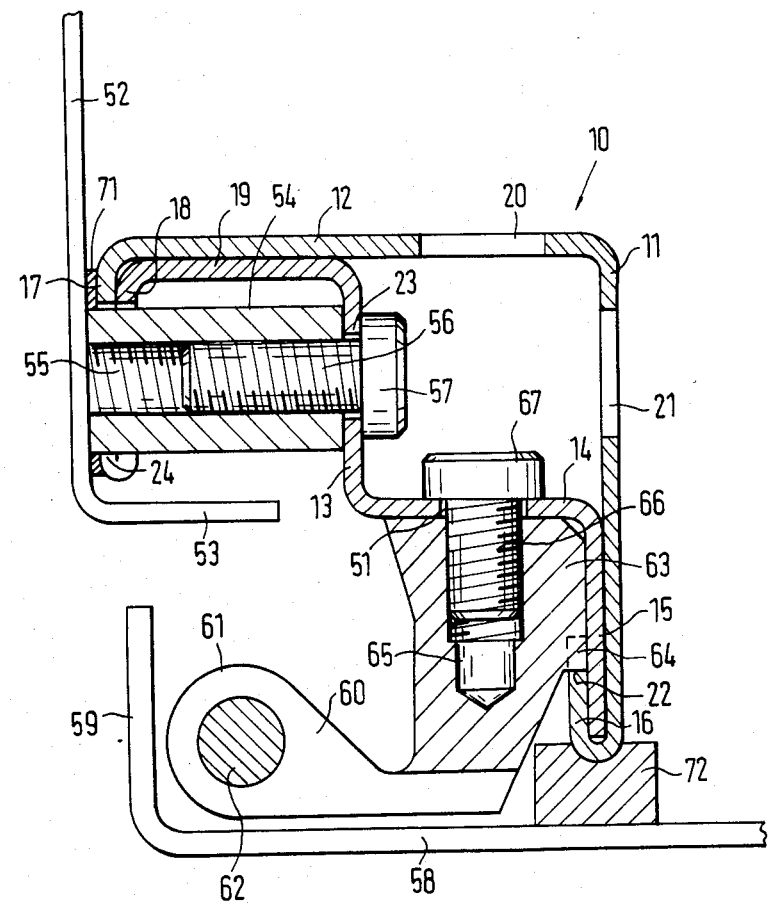
FIG. 13 is a cross-sectional view showing the installation of a door and a side panel on a frame section.

The cross-sectional view of FIG. 13 shows how a door 58 can be hinged to a vertical frame section. Hinge element 60 is employed and is secured to side section 14 of hollow rectangular structure 10 by means of screw 66. Hinge 60 includes fastening block 63 having threaded portion 65 for receiving screw 66 threadedly inserted therein. Screw 66 with head 67 is introduced through hole 20 in side section 12 and is inserted through bore 51 in side section 14 and screwed into screw thread 65 of fastening block 63. The fastening surface of block 63 abutting section 15 of the frame section is provided with counter serrations 64 which engage the serrations on end section 16, namely, notches 22. Thus, fastening block 63 may be attached at predetermined locations on the flat side section of a frame section. Hinge hole 61 receives bearing bolt 62 attached to the inner side of door 58 which has turned in flange 59. Affixed to the inner side of door 58 is flat sealing element 72 which extends aligned with the leg section and affords positive sealing between the frame section and door 58. Sealing member 72 forms a frame which corresponds to the frame-shaped sealing strut on the exterior of the frame structure, the sealing strut formed by the flat side section of the hollow rectangular section. Likewise, the rear of the framework may be closed by a door.

As also shown in FIG. 13, side panel 52 with its turned in flange 53 may extend into the abutment frame formed by end sections 17 of the hollow, rectangular structures. On the inner side of side panel 52, sockets 54 have screw threads 55 for receiving threaded screws 56. Screw 56 with its head 57 is introduced through hole 21 in side section 11 and is inserted through bore 23 in side section 13 and screwed into the threaded portion of socket 54. The connection between side panel 52 and the hollow, rectangular structure is sealed by sealing member 71.

In like manner, a rear panel may be secured to side section 14 of a frame section. The rear panel may be provided with identical threaded sockets since the flat side section and the angularly bent side section extend along respective side sections 11, 12 by an equal distance.

Figure 14:
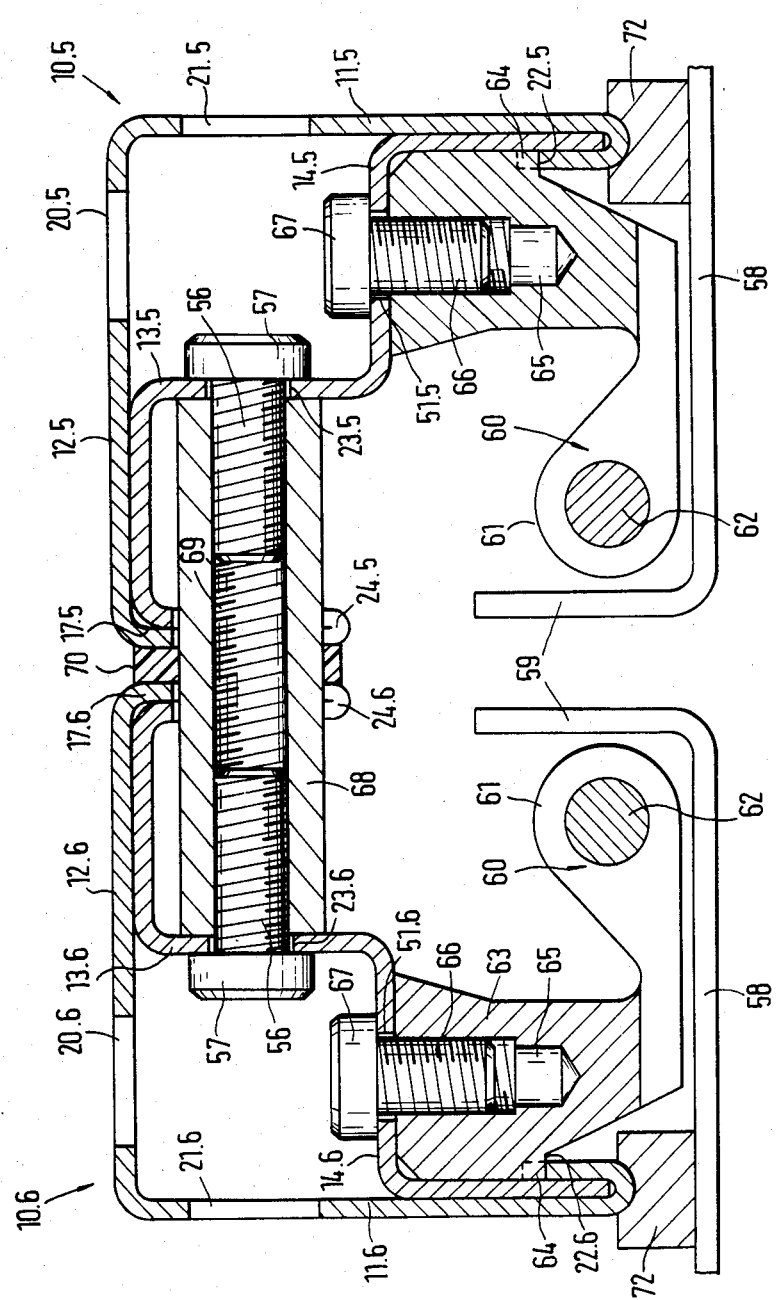
FIG. 14 is a cross-sectional view showing the connection of two framework structures, both closed by doors.

FIG. 14 illustrates two vertical frame sections 10.6, 10.5 of two laterally joined frame sections. End sections 17.5, 17.6 of vertical frame sections 10.6, 10.5 form two identical abutment frames. Sealing member 70 is disposed adjacent and between the abutment frames and seals the joint. Screw threaded socket 68 is disposed between side sections 3.5, 13.6 of frame sections 10.5, 10.6. Attachment is established using two screws 56. One screw 56 having head 57 is introduced through hole 21.5 in side section 11.5 of frame section 10.5 and is inserted through bore 23.5 in side section 13.5 into one end of threaded portion 69 of socket 68. Another screw 56 with head 57 is introduced through hole 21.6 in side section 11.6 of frame section 10.6 and is inserted through bore 23.6 in side section 13.6 into the opposite end of threaded portion 69 of socket 68. Bores 23.5, 23.6 are aligned with holes 21.5, 21.6 and apertures 24.5, 24.6 in end sections 17.5, 17.6 of the angular side section. At least two such connections are placed along the length of frame sections 10.5 and 10.6. Also the frame sections facing each other at the opposite side of the framework structure are joined to each other and sealed in like manner. Two doors 58 may be hinged to side sections 14 of frame sections 10.5, 10.6. The door 58 which is hinged to frame section 10.5 is installed at its left hand edge, while door 58, hinged to frame section 10.6, is installed at its right hand edge. Bores 51.5, 51.6 in side walls 14.5, 14.6 are adapted to receive screws 55 to secure hinge elements 60. Otherwise, hinged attachment of the doors is the same as in FIG. 13. Counter serrations 64 of block 63 are of identical configuration and are suitable for both left and right hand installation of doors 58, and engage notches 22.5, 22.6 between the teeth on the end sections of the flat side sections.

We claim:

1. Framework for a switchboard cabinet comprising at least twelve interconnecting frame sections (10) having the same cross-sectional configuration, each said frame section (10) comprising a first external side (11) and a second external side (12) substantially perpendicular to one another and joined at one end by an exterior corner (27), an opposite terminal end of said first external side (11) substantially planar with said first external side (11), and an opposite terminal end of said second external side (12) forming an end section (17) extending substantially perpendicular inwardly from said second external side (12); a first internal side (13) and a second internal side (14) shorter than said first and second external sides (11, 12), respectively, and extending at substantially right angles to one another and joined at one end by an internal corner, opposite ends of said first and second internal sides (13, 14) abutting said second and first external sides (12, 11), respectively, said internal sides (13, 14) forming in combination with said external sides (11, 12) a hollow, generally rectangular receiving space (28); four said frame sections (10) joined at their ends to form a rectangular first frame having a central opening, four said frame sections (10) joined at their ends to form a rectangular second frame having a central opening, said second frame substantially coextensive with said first frame, said first and second frames maintained in parallel spaced relation forming a first pair of substantially parallel opposite sides of said framework structure, said parallel spaced relation maintained by four spaced said frame sections (10) joining said first frame to said second frame, said four spaced frame sections forming in combination with frame sections of said first and second frames a second pair of substantially parallel opposite sides having central openings, a top and a substantially parallel opposite bottom, each having a central opening; said frame sections (10) comprising said framework structure aligned to provide said exterior corners (27) of each said frame section (10) directed to the interior of said framework structure, said opposite terminal ends of said first external sides (11) forming a sealing strut around said opening of said first pair of opposite sides, said sealing strut extending substantially perpendicular to the plane of said first pair of opposite sides, said opposite terminal ends of said second external sides (12) forming an abutment frame around the outer edges of an opening of said second pair of opposite sides of said framework structure, said abutment frame extending parallel to the plane of said second pair of opposite sides.

2. Framework according to claim 1, wherein said external sides (11, 12) and said internal sides (13, 14) form a square said receiving space (28).

3. Framework according to claim 1, wherein said external sides (11, 12) are provided with rectangular holes (21, 20) spaced at regular intervals.

4. Framework according to claim 3, wherein bores (25, 26) are provided between said rectangular holes (20, 21) and are spaced midway therebetween.

5. Framework according to claim 4, wherein said holes (20, 21) and said bores (25, 26) in all vertical said frame sections joining said bottom to said top are disposed in identical horizontal planes, said holes (20, 21) and said bores (25, 26) in all horizontal said frame sections extending parallel to the plane of said first pair of opposite sides of said framework structure are disposed in identical vertical planes extending parallel to said first pair of opposite sides of said framework structure, and that said holes (20, 21) and said bores (25, 26) of horizontal said frame sections extending parallel to the plane of said second pair of opposite sides of said framework structure are disposed in identical vertical planes parallel to said plane of said second pair of opposite sides.

6. Framework according to claim 3, wherein said opposite terminal end of said first external side (11) of said frame sections (10) is provided with an enlarged end section 16, and said enlarged end section (16) has a toothed section with rectangular teeth and notches (22) adjacent said receiving space (28) which are aligned with said rectangular holes (20, 21) in said external sides (11, 12).

7. Framework according to claim 6, wherein said frame sections are welded to each other at their junctions (29).

8. Framework according to claim 6, wherein said frame sections are joined to each other at their junctions by corner connectors (30) having projections sized for insertion into said hollow receiving spaces (28) of said intersecting frame sections.

9. Framework according to claim 8, wherein said frame sections are screwed to said corner connectors (30) at their junctions.

10. Framework according to claim 8, wherein said frame sections are welded to said corner connectors (30) at their junctions.

11. Framework according to claim 3, wherein additional tranverse struts (44) having at least two sides provided with rows of holes (49, 45) identical to said rectangular holes (20, 21) in said frame sections of said framework are fastened to said frame sections to join any two frame sections forming a plane parallel to the plane of said top and said bottom of said framework structure.

12. Framework according to claim 11, wherein said transverse struts (44) have four side walls forming a rectangular interior receiving space which corresponds to said hollow receiving space (28) of said frame sections (10), and that said interior receiving space of said transverse struts is accessible by means of a continuous slot (48) in one said side wall of said transverse strut (44).

13. Framework according to claim 12, wherein a block-shaped rectangular nut (40) is inserted into said interior receiving space of at least one said transverse strut (44), said nut is secured by a screw (37) to one said frame section (10) of said framework.

14. Framework according to claim 13, wherein said block-shaped rectangular nut (40) is provided with bores having screw threads (43) and at least one end has a rectangular projection (42) which corresponds with said rectangular holes (20, 21) in said frame sections (10), and one side of said transverse strut (44) has fastening bores (47).

15. Framework according to claim 14, wherein said screw (37) has a rectangular head (38), two sides of said rectangular head (38) having a dimension corresponding to the dimension of said rectangular holes (20, 21) in said frame sections of said framework and two sides of said rectangular head (38) having a dimension slightly greater, yet permitting oblique insertion of said rectangular head (38) into said rectangular holes (20, 21).

16. Framework according to claim 15, wherein said screw (37) has a tool holder (39) at the terminal end of its threaded shank section opposite said rectangular head (38).

17. Framework according to claim 16, wherein nuts (31) comprising a rectangular block (32) and a raised rectangular insertion member (33) extending from one side of said block with an internal screw thread (34) therein are non-rotatably inserted into said rectangular holes (20, 21), (45, 49) on said external sides (11, 12) of said frame sections and in said transverse struts (44) respectively, each said nut (31) having a handle (35) which projects through one said rectangular hole (20, 21), (49, 45) adjacent and in a plane perpendicular to said rectangular hole retaining said raised rectangular insertion member (33).

18. Framework according to claim 17, wherein said handle (35) is detachable from said nut (31) at a weakened breaking point (36).

19. Framework according to claim 18, wherein said block (32) of said nut (31) with said handle (35) detached is utilized as a sliding nut in a contoured section having a receiving space corresponding to said raised rectangular insertion member (33).

20. Framework according to claim 19, wherein said internal sides (13, 14) adjacent said external sides (11, 12) are provided with fastening bores (23, 51) aligned with corresponding said rectangular holes (20, 21) on said external sides (11, 12).

21. Framework according to claim 20, wherein said end sections (17) at said opposite terminal ends of said second external sides (12) are provided with slot-like apertures (24) aligned with said fastening bores (23) of said first internal sides (13).

22. Framework according to claim 6, wherein hinges (60) are fastened to said enlarged end section (16) of said first external side (11) of said frame sections (10), said hinges (10) having a toothed segment (64) on a fastening surface which engages with said teeth and notches on said enlarged end section (16) of said first external side (11).

23. Framework according to claim 22, wherein said second internal side (14) adjacent said first external side (11) has an extension section (15) abutting said first external side (11), forming two layers (11, 15), and at said opposite terminal end of said first external side (11) said enlarged end section (16) is formed by an extension of said first external side (11) being turned inward upon said extension section (15), said enlarged end section (16) having a toothed segment with notches (22).

24. Framework according to claim 23, wherein all said corners and said terminal ends of said frame sections (10) are rounded.

25. Framework according to claim 1, wherein side panels (52) and doors (58) are mounted on said frame sections (10) comprising said framework structure, each said side panel (52) and said door (58) having a flange (53, 59), respectively, which extends around said sealing struts and abutment frames formed by said frame sections (10), and said side panels (52) and said doors (58) have sealing elements (70, 71, 72) in the region of their abutment with said framework.

26. Framework according to claim 1, wherein said external sides (11, 12) extend from said exterior corner (27) for the same length.

* * * * *